United States Patent [19]
Celler et al.

[11] Patent Number: 5,051,326
[45] Date of Patent: Sep. 24, 1991

[54] X-RAY LITHOGRAPHY MASK AND DEVICES MADE THEREWITH

[75] Inventors: George K. Celler, New Providence; Lee E. Trimble, Hillsborough, both of N.J.

[73] Assignee: AT&T Bell Laboratories, Murray Hill, N.J.

[21] Appl. No.: 358,312

[22] Filed: May 26, 1989

[51] Int. Cl.$^5$ ................................................ G03F 9/00
[52] U.S. Cl. ........................................ 430/5; 378/35; 430/966; 430/967
[58] Field of Search ................ 430/5, 966, 967; 378/35

[56] References Cited

U.S. PATENT DOCUMENTS 4,451,544  5/1984  Kawabuchi ............................ 430/5

FOREIGN PATENT DOCUMENTS 0244246  4/1987  European Pat. Off. ............... 378/35
213131  12/1984  Japan ..................................... 430/5

OTHER PUBLICATIONS

A. Heuberger, *Journal of Vacuum Science and Technology*, B6, 107 (1988).
J. P. Silverman, et al., *Journal of Vacuum Science and Technology*, B6 2147 (1988).
S. M. Sze, *VLSI Technology*, Second Edition, McGraw Hill Book Co., New York, 1988, pp. 238-248.
E. I. Bromley, et al., *Journal of Vacuum Science Technology*, B1, 1364 (1983).

Primary Examiner—Charles L. Bowers, Jr.
Assistant Examiner—Thomas R. Neville
Attorney, Agent, or Firm—B. S. Schneider

[57] ABSTRACT

A mask for X-ray lithography is produced by initially forming a thin layer of polycrystalline silicon on a silicon oxide containing substrate. A portion of the substrate at the periphery of the major surface opposite the silicon layer is masked. The exposed portion of the substrate is removed by an etchant that is selective for silicon oxide containing composition relative to silicon, e.g. aqueous HF. The resulting membrane of silicon on a peripheral region of silicon oxide containing compositions is in tensile stress as required for lithography, but is robust. Metal, X-ray absorbing patterns are formed on the silicon by standard lithographic procedures.

5 Claims, 1 Drawing Sheet

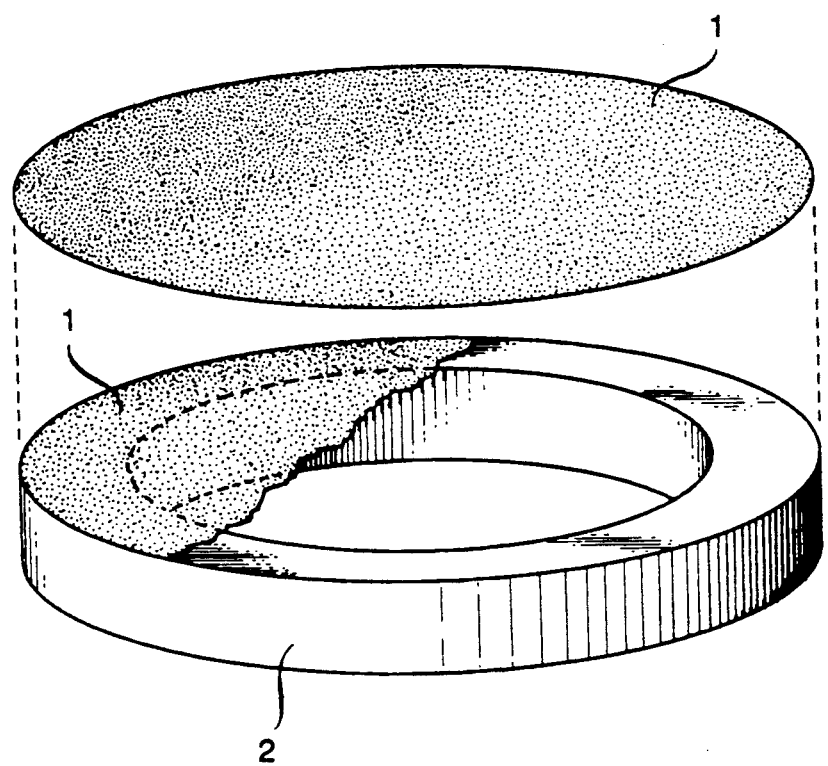

X-RAY LITHOGRAPHY MASK AND DEVICES MADE THEREWITH

BACKGROUND OF THE INVENTION

1. Field of the Invention

This invention relates to IC fabrication and, in particular, IC fabrication utilizing strict design rules.

2. Art Background

It is presently contemplated that X-ray lithography will be employed for making integrated devices having design rules of 0.25 μm and stricter while possible use at even 0.5 μm has not been ruled out. (The design rule defines the lateral dimension of the smallest critical feature in the device pattern.) In such processes a substrate is coated with a material that is photosensitive to X-ray radiation. This material is exposed in a pattern defined by a mask for incident X-rays. The exposed photosensitive material is then developed by selective removal of either the exposed or unexposed portions. The resulting patterned substrate is further used through processes such as etching or deposition to advance towards completion of the device.

An X-ray mask for lithography generally includes a desired pattern of material that substantially attenuates X-ray radiation (absorbs more than 80% of incident radiation of wavelength suitable for inducing reaction in the photosensitive material) and a body for mechanical support of this attenuating material. However, a body of substantial thickness underlying the patterned region unacceptably attenuates X-ray transmission in regions that should be transmissive. Generally, to avoid this difficulty, the attenuating material is formed on a thin membrane (0.5 to 5μ thick) that is supported at its periphery by a thicker, typically ring shaped, region. Ideally, this membrane should be relatively robust, e.g., capable of withstanding pressures of 200 Torr for a 3 cm in diameter membrane of 2 μm thickness, and economic to manufacture. However, membranes in general, and X-ray masks in particular, typically do not satisfy these requirements.

The most widely investigated X-ray mask involves the formation of a heavily boron doped silicon membrane. This mask is fabricated by forming a thin region of heavily boron doped silicon on a silicon wafer. The periphery of the silicon substrate on the major surface opposite from the doped silicon is covered with an etch resistant material. The subtrate is then immersed in an etchant that selectively removes undoped silicon relative to boron doped material. (Selectively etching in this context is an etch rate of the substrate at least 50, preferably 500, more preferably 1000 times faster than the membrane.) With appropriate selectivity, the undoped silicon of the substrate exposed to the etchant is removed while the thin layer of boron doped silicon remains. However, sufficient selectivity to avoid substantial thinning of the boron doped silicon is not obtained unless the boron dopant concentration is at least $5 \times 10^{19}$ cm$^{-3}$ and the boron doped silicon material is epitaxially grown as a single crystal on the silicon substrate.

The formation of a relatively heavily doped epitaxial silicon region is not an inexpensive fabrication procedure. A heavily boron doped silicon membrane is relatively transparent to X-rays and has a tensile stress in the range $3 \times 10^8$ to $5 \times 10^9$ dynes/cm$^2$ ensuring freedom from membrane deformation. However, the single crystalline silicon membrane is susceptible to fracture along crystallographic planes. Thus, these membranes are neither robust nor are they economic to manufacture. As a result, presently contemplated X-ray lithography masks are not totally satisfactory.

SUMMARY OF THE INVENTION

By employing an X-ray mask having a polysilicon membrane, sufficient tensile stress is obtained to avoid deformation while ease of manufacture and robustness is achieved. Such membranes are produced by forming a thin polysilicon region on a substrate that comprises a silicon oxide containing composition, e.g. silica, silicates such as borosilicates, and quartz, and etching away, for example, in aqueous HF all the silicon oxide containing composition but that at the periphery of the substrate. Polysilicon, relative to silicon oxide compositions, has extremely high selectivity, e.g. above 1000 to conventional etchants such as aqueous HF and thus a polycrystalline silicon membrane is easily produced. This membrane has a tensile strength of $2 \times 10^9$ and because of its polycrystalline nature is less susceptible to fracture. Since epitaxial growth is not required, less care is needed in the fabrication procedure, and yet the polysilicon membrane is robust under typical handling conditions. The X-ray attenuating pattern is either formed before selective etching to produce the membrane or is formed by conventional lithographic procedures after the membrane has been fabricated. Such membranes are then utilized in X-ray lithography techniques such as described in A. Heuberger, *Journal of Vacuum Science and Technology*, B6, 107 (1988).

BRIEF DESCRIPTION OF THE DRAWINGS

The FIGURE is an exploded view of an illustrative mask configuration involved in the invention.

DETAILED DESCRIPTION

As discussed, the X-ray masks involved in the invention are employed in an X-ray lithographic exposure to produce devices such as optical and/or semiconductor devices. These masks include a pattern of X-ray attenuating material disposed on a membrane. A description of X-ray exposure through a mask and subsequent device processing is found in Heuberger, supra and J. P. Silverman, et al. *Journal of Vacuum Science and Technology*, B6, 2147 (1988), respectively. Membrane formation is achieved by the selective etching of a silicon oxide relative to a polysilicon region. This selective etching is accomplished on a body that includes a silicon oxide substrate with an overlying thin region of polycrystalline silicon.

Portions of the silicon glass substrate ultimately lend mechanical stability to X-ray masks. To afford such stability, typically a substrate having a thickness in the range 0.2 to 5 mm is employed. Substrates having a thickness less than 0.2 typically do not lend sufficient stability while substrates having a thickness greater than 5 mm are undesirable because the etch time becomes excessive. The substrate material should comprise a silicon oxide containing composition, e.g. silica, silicate glass such as borosilicates, and quartz.

A layer of polycrystalline silicon, 1 is formed on a major surface of the silicon oxide containing substrate. In this context, polycrystalline silicon should have at least $10^6$ grains per cm$^2$. Material having less than $10^6$ grains per cm$^2$ tends to be rough which complicates processing and alignment of the mask with the device substrate to be exposed. The thickness of this polycrystalline layer ultimately determines the thickness of the membrane. Typically, polycrystalline silicon layers having thickness in the range 0.5 to 5 μm are employed. Thickness greater than 5 μm generally lead to unacceptable attenuation of X-rays while thicknesses less than 0.5 μm are generally insufficiently rigid. Doping of the polycrystalline silicon is acceptable. Dopants such as boron and arsenic typically in concentrations up to $10^{20}$ cm$^{-3}$ are not precluded. Compositional modification of the silicon composition is acceptable provided the selectivity of etching relative to the silicon oxide is maintained greater than 100.

Once the polysilicon/silicon oxide containing substrate is formed, a peripheral region of the silicon oxide containing substrate on the major surface opposite from the polysilicon region is covered with a material that is not substantially removed during the etching process. For etchants such as aqueous HF acid suitable covering materials include polycrystalline silicon. The covered region on the periphery on the silicon oxide containing substrate protects the portion of this substrate remaining after membrane formation. This region, as previously discussed, lends mechanical stability to the membrane. Typically, the surface area of this remaining peripheral region should be at least 30 percent of the area of the membrane. If the membrane with the peripheral silicon oxide containing composition is in turn mounted on a more rigid ring, a smaller peripheral region is acceptable.

Once the periphery of the substrate has been covered with suitable material, the body is subjected to a selective etchant. Etchants such as aqueous HF, for example, 49% HF in water are advantageously employed. The etching process is continued until the uncovered region of the substrate is essentially entirely removed having the structure shown in the figure including peripheral region, 2 and membrane, 1. Typical etch rates for aqueous HF on silica is 0.07 mm/hr at room temperature and 0.25 mm/hr at 60° C. Generally, for typical substrate thicknesses, etching times in the range 2 to 7 hours are employed. Etching beyond the time necessary to remove the uncovered areas of the substrate is not precluded. Typically, in time periods up to one day at room temperature, substantial portions of the polysilicon membrane or silicon oxide containing peripheral region are not removed.

Generally, the resulting membrane has a tensile stress in the range $1 \times 10^9$ to $2 \times 10^9$ dynes/cm$^2$. It is typically desirable to maintain tensile stress in the range $3 \times 10^8$ to $5 \times 10^9$ dynes/cm$^2$. Stresses greater than $5 \times 10^9$ dynes/cm$^2$ tend to induce fracture, and stresses less than $3 \times 10^8$ dynes/cm$^2$ tend to allow deformation of the membrane. If a membrane after processing has a tensile strength greater than $5 \times 10^{19}$ dynes/cm$^2$, it is possible to relieve some of this stress by techniques such as annealing. For example, a membrane subjected to a temperature of 1150° C. for a time period of 45 minutes reduces stress in an undoped polycrystalline silicon membrane to essentially zero. Therefore, an appropriate annealing time is chosen using a control sample to yield the desired tensile stress. The membranes formed not only have appropriate tensile strength but are robust and are economically made utilizing well established processing steps.

To produce a desirable X-ray mask, an X-ray attenuating pattern is formed on the membrane surface. Materials suitable for such attenuation include heavy metals that have an atomic number greater than 72. The desired pattern of X-ray attenuating material is either formed before or after the membrane has been fabricated. In either case, conventional lithographic techniques are employed to produce the desired pattern. Irrespective of the time of formation, generally a layer of the X-ray attenuating material is deposited either on the membrane after fabrication, or on the material to be formed into a membrane before formation. A conventional resist such as a conventional photoresist in conjunction with conventional etching, dry or wet, and/or in conjunction with convention deposition processes, is employed to form the pattern in the X-ray attenuating material.

The following examples are illustrative of conditions suitable for producing the X-ray masks involved in the invention.

EXAMPLE 1

A fused silica substrate measuring 4 inches in diameter having a thickness of 0.5 mm and having a sodium content less than 0.05 weight percent was employed as the substrate. A cleaning solution was prepared by mixing 24 kg of concentrated sulfuric acid with 1200 ml of 30 percent hydrogen peroxide. The solution was heated to 105° C. and the wafer was immersed in it for approximately 10 min. The wafer was rinsed in distilled water and spun dry. Twelve of these wafers were inserted in a quartz boat sample holder of an LPCVD deposition apparatus with their major surface in a vertical direction. The spacing between substrates was approximately 3 mm. Polycrystalline silicon was deposited to a thickness of 1 μm on both sides of each substrate utilizing the procedure described in S. M. Sze, *VLSI Technology*, Second Edition, McGraw Hill Book Co., New York 1988, pages 238-248, with a deposition temperature of 630° C. and a silane partial pressure of 300 millitorr. The substrates were removed from the deposition apparatus and a layer of novolac resist was deposited by spinning to a thickness of 1 μm on both sides of the substrate. The photoresist on one side of the wafer was exposed through a mask that allowed transmission of exposing light through its center to a diameter of 1.5 inches. The exposed photoresist was then developed utilizing the proprietary developer provided by the resist manufacturer. An etchant was prepared from concentrated nitric acid, 49% aqueous HF and glacial acetic acid in the ratio of 5 to 1 to 1. The wafer was then immersed in this mixture for a period of approximately one minute to remove the 1 μm thick polycrystalline region exposed after lithography. The wafer was then rinsed, spun dry and immersed in a photoresist stripper at a temperature of 100° C. for approximately 1 hour.

The wafer masked on its backside by a ring of polycrystalline silicon was then immersed in concentrated aqueous HF at room temperature. After approximately 7 hours the wafer was removed and rinsed in distilled water and allowed to dry. The resulting structure had a membrane with a thickness of approximately 1 μm stretched across a ring of fused silica. The tensile stress of the membrane as measured by a test described in E. I. Bromley, et al. *Journal of Vacuum Science Technology*, B1, 1364 (1983), was $1.7 \times 10^9$ dynes/cm$^2$. By the same procedure the elastic modulus was measured at $3.3 \times 10^{12}$ dynes/cm$^2$ and the fracture strength was measured at $4.2 \times 10^9$ dynes/cm$^2$. Light of varying wavelength was made incident on a membrane using a Hewlett Packard Spectrophotometer. Transmitted light was detected using the same spectrophotometer. The average transmittance in the wavelength range 600 to 700 nanometers was 17%. A transmission electron micrograph showed columnar grains approximately 500 Å in diameter. The long axis of the column was in the growth direction. The surface roughness as measured on a WYCO optical interferometer was less than 100 Å peak to valley.

EXAMPLE 2

The procedure of Example 1 was followed except the etch in concentrated aqueous HF was performed for 2 hours at 60° C. The results obtained were approximately the same.

We claim:

1. A process for fabricating an exposure mask suitable for X-ray lithography, said mask comprising a region of X-ray attenuating material on an essentially uninterrupted polycrystalline silicon membrane, said process comprising the steps of 1) forming a body comprising a polycrystalline silicon region on a first surface of a substrate comprising a silicon oxide containing composition, 2) covering a peripheral region of said substrate on the second surface opposing said first surface, 3) subjecting said body to an etchant that selectively etches said silicon oxide containing composition relative to said silicon such that the uncovered region of said substrate is etched to form said membrane and 4) at some point during said process forming said X-ray attenuating region.

2. The process of claim 1 wherein said silicon oxide containing composition comprises a material chosen from the group consisting of silica, silicates and quartz.

3. The process of claim 1 wherein said etchant comprises aqueous HF.

4. A mask suitable for X-ray lithography, said mask comprising a patterned X-ray attenuating material disposed on an essentially uninterrupted polycrystalline silicon membrane, said membrane being supported by a region comprising a silicon oxide containing composition wherein said membrane is sufficiently thin so that it does not substantially attenuate said X-rays.

5. The mask of claim 4 wherein said silicon oxide containing composition comprises a material chosen from the group consisting of silica, silicates and quartz.

* * * * *